(12) United States Patent
Wang et al.

(10) Patent No.: US 12,126,286 B2
(45) Date of Patent: Oct. 22, 2024

(54) FAULT TOLERANCE DECISION-MAKING METHOD AND SYSTEM FOR SENSOR FAILURE OF VEHICULAR WHEEL HUB DRIVING SYSTEM

(71) Applicant: Zhejiang University of Science and Technology, Hangzhou (CN)

(72) Inventors: Zihui Wang, Hangzhou (CN); Weigong Zhao, Hangzhou (CN); Zhiyuan He, Hangzhou (CN); Jiongjiong Cai, Hangzhou (CN); Zhentao Qian, Hangzhou (CN)

(73) Assignee: ZHEJIANG UNIVERSITY OF SCIENCE AND TECHNOLOGY, Hangzhou (CN)

( * ) Notice: Subject to any disclaimer, the term of this patent is extended or adjusted under 35 U.S.C. 154(b) by 140 days.

(21) Appl. No.: 18/068,947

(22) Filed: Dec. 20, 2022

(65) Prior Publication Data
US 2023/0278366 A1    Sep. 7, 2023

(30) Foreign Application Priority Data

Mar. 1, 2022    (CN) .......................... 202210192984.2

(51) Int. Cl.
*B60B 27/00*    (2006.01)
*G01R 1/04*    (2006.01)
(Continued)

(52) U.S. Cl.
CPC .......... *H02P 25/024* (2016.02); *G01R 1/0416* (2013.01); *G01R 19/003* (2013.01);
(Continued)

(58) Field of Classification Search
CPC .... H02P 25/024; H02P 27/047; H02P 29/028; H02P 21/18; H02P 6/182; H02P 6/183;
(Continued)

(56) References Cited

U.S. PATENT DOCUMENTS

2004/0263099 A1* 12/2004 Maslov .................. B60L 50/20
                                                   318/400.24
2018/0102719 A1    4/2018 Oka et al.
2018/0226906 A1    8/2018 Chen et al.

FOREIGN PATENT DOCUMENTS

CN    102075131    5/2011
CN    106998164    8/2017
(Continued)

OTHER PUBLICATIONS

Chinese Office Action, issued in the corresponding Chinese patent application No. 202210192984.2, dated Jul. 25, 2022, 12 pages with machine translation.

*Primary Examiner* — Peter D Nolan
*Assistant Examiner* — Demetra R Smith-Stewart
(74) *Attorney, Agent, or Firm* — HSML P.C.

(57) ABSTRACT

The present invention belongs to the technical field of electric automobiles and particularly relates to a fault tolerance decision-making method and system for sensor failure of a vehicular wheel hub driving system. The method comprises a current sensor failure diagnostic process, a position/velocity sensor failure diagnostic process and a selection process for a wheel hub motor fault tolerance control method. The system comprises a current sensor failure diagnostic module, a position/velocity sensor failure diagnostic module and a selection module for a wheel hub motor fault tolerance control method. The position/velocity sensor failure diagnostic module further comprises a fault tolerance control switching module. The present invention has the characteristics of establishing a control strategy decision-making mechanism oriented to random complicated current and position sensor failure conditions and designing a multivariable decision-making model according to a vehicular velocity range and a sensor fault condition to (Continued)

realize a fault tolerance control process compatible with a full velocity range.

8 Claims, 3 Drawing Sheets

(51) Int. Cl.
　　*G01R 19/00* (2006.01)
　　*G01R 19/165* (2006.01)
　　*G01R 31/28* (2006.01)
　　*H02P 25/024* (2016.01)
　　*H02P 27/04* (2016.01)
　　*H02P 29/028* (2016.01)

(52) U.S. Cl.
　　CPC ..... *G01R 19/16538* (2013.01); *G01R 31/2829* (2013.01); *G01R 31/2836* (2013.01); *H02P 27/047* (2013.01); *H02P 29/028* (2013.01); *B60B 27/0068* (2013.01)

(58) Field of Classification Search
　　CPC ........ H02P 21/22; H02P 27/085; H02P 27/12; H02P 2207/05; G01R 1/0416; G01R 19/003; G01R 19/16538; G01R 31/2829; G01R 31/2836; G01R 31/006; B60B 27/0068; Y02T 10/72
　　See application file for complete search history.

(56) References Cited

FOREIGN PATENT DOCUMENTS

| | | | |
|---|---|---|---|
| CN | 110481338 A | * 11/2019 | ............. B60L 15/20 |
| CN | 111740683 | 10/2020 | |
| CN | 109586636 | 4/2021 | |
| JP | 2009-027905 | 2/2009 | |

* cited by examiner

FIG. 1

| Verification condition | | | | Diagnostic conclusion | Current failure type |
|---|---|---|---|---|---|
| C1 | C2a | C2b | C2c | | |
| Y | Y | Y | Y | P | CE0 |
| Y | N | N | N | $F_{bus}$ | |
| N | N | Y | Y | $F_a$ | CE1 |
| N | Y | N | Y | $F_b$ | |
| N | Y | Y | N | $F_c$ | |
| N | N | N | Y | $F_a, F_b$ | |
| N | N | Y | N | $F_a, F_c$ | CE2 |
| N | Y | N | N | $F_b, F_c$ | |
| 0 | N | N | N | $F_a, F_b, F_c$ | |
| 0 | 0 | 0 | 0 | $F_{bus}, F_a, F_b, F_c$ | CE3 |

FIG. 2

| Vehicular velocity range | Verification condition | Diagnostic conclusion | Velocity failure type |
| --- | --- | --- | --- |
| Full velocity | Y | P | VE0 |
| High velocity | N | F | VE1 |
| Low velocity | N | F | VE2 |
| Zero velocity | N | F | VE3 |

FIG. 3

| CE \ VE | CE0 | CE1 | CE2 | CE3 |
| --- | --- | --- | --- | --- |
| VE0 | M1 | M1 | M1 | M5 |
| VE1 | M2 | M2 | M2 | M6 |
| VE2 | M3 / M4 | M3 / M4 | M4 | M6 |
| VE3 | M3 / M4 | M3 / M4 | M5 | M6 |

Control method          Control effect

M1: vector control with sensor
M2: vector control without sensor with counter potential
M3: vector control without sensor with high frequency injection
M4: I/F control
M5: V/F control
M6: shut down the faulted motor and cut off power Optimum Ordinary Out of control

FAULT TOLERANCE DECISION-MAKING METHOD AND SYSTEM FOR SENSOR FAILURE OF VEHICULAR WHEEL HUB DRIVING SYSTEM

FIELD OF TECHNOLOGY

The present invention belongs to the technical field of electric automobiles and particularly relates to a fault tolerance decision-making method and system for sensor failure of a vehicular wheel hub driving system.

BACKGROUND

Distributed wheel hub motor drive is a development direction of light electric automobiles in the future. A multi-wheel distributed driving system for an electric automobile is a typical over-redundancy system which jointly provides driving forces by a plurality of independent hub motor driving wheels, and still can maintain vehicle operating dependent on other driving wheels under a condition that a part of driving wheels fails, so that the system has good fault tolerance performance.

A permanent magnet synchronous motor or a permanent magnet brushless direct current motor is usually used at a distributed vehicular wheel hub motor driving mechanism to realize precise and efficient torque closed-loop control in combination with a vector control algorithm. A current sensor and a position sensor are key sensing components in the driving system. The position sensor acquires rotor position signals and velocity signals of motors, and the current sensor acquires motor currents. A controller implements a vector control strategy, so that the torque and rotating speed of the motors are controlled precisely. Affected by factors such as vibration, dampness and abnormal power supply on the move, the current and velocity position sensors have a certain probability of being interfered or failing, so that decoupling of current signals in the vector control algorithm produces errors, resulting in decreased torque control precision and deteriorated power output feature. Particularly for a vehicle with a four-wheel distributed driving architecture, sudden failure of single driving wheel in high velocity driving may impose large sway and stall on the vehicle body, resulting in potential safety hazards.

Since key sensors of the distributed driving system have signal redundancy, it is available that fault signals can be replaced by redundant signals when fails, so that flexible and steady operation of the wheel hub motors can be still maintained to realize fault tolerance control under a condition that the sensors fail. A position sensorless algorithm and a current reconstruction method are one of solutions to realize fault tolerance operation. Under a condition that the sensors fail in vehicle driving, the position sensorless algorithm and the current reconstruction method can quickly take over feedback signals of the position/velocity sensors and the current sensors so as to realize effective control of the torque of the wheel hub motor. In a case where the position/velocity sensor on a motor fails or generates a signal deviation, the required motor rotor position and velocity information can be replaced by means of the position sensorless algorithm instead of the wrong feedback signal. In a case where part of the current sensors on the driver fail or generate signal deviations, the controller can implement a current reconstruction technique by virtue of a redundant current sensor to replace three-phase current signals. Therefore, the system can implement fault tolerance control when the position sensor and the current sensor fail, thereby further improving the safety and smoothness of the distributed driving system and increasing the safety redundancy of the system.

However, there is a limitation to implement the position sensorless algorithm, the reliability of which is mainly dependent on the running speed of the vehicle, i.e., the rotating speed of the motor. It is usual to use different types of sensorless algorithms when the motor is in a high rotating speed range, a low rotating speed range and is idled. On the other hand, for various fault conditions such as single failure, multiple failures and all failures of the current sensors, a motor driver needs to choose different control strategies according to current reconstruction effectiveness. During vehicle driving, the fault conditions of the position sensors and the current sensors occur randomly. Different sensor failures at different vehicle speeds will be combined as complicated failure conditions, resulting in complicated adverse effects to the control system. Therefore, it is needed to be compatible with various failure states of the key sensors in a full velocity range to form a fault tolerance decision-making mechanism, so as to guarantee the safety and reliability of the driving system of the vehicle.

Based on the above-mentioned problems, a fault tolerance decision-making method and system for sensor failure of a vehicular wheel hub driving system is designed, which is capable of establishing a control strategy decision-making mechanism oriented to random complicated current and position sensor failure conditions and designing a multivariable decision-making model according to a vehicle velocity range and a sensor fault condition to realize a fault tolerance control process compatible with a full velocity range.

For example, a Chinese patent literature with application No. CN201811372696.5 describes a permanent magnet motor driving controller of a traditional centralized driven electric automobile with a thrust-vector control method, and provides a fault tolerance control solution for motor position sensor failure. In the solution, aiming at a position sensor fault condition during low velocity running a method for injecting a high frequency detection signal into a redundant winding of a permanent magnet motor is used for extracting position and velocity information of the motor so as to replace the position sensor signal, thereby improving the reliability of the position and velocity detection. However, the above-mentioned solution only considers a partial running condition that the vehicle runs at a low velocity and does not involves high velocity running range, and the stability with load of the vector control system based on high frequency injection sensorless estimation algorithm is poor under a variable velocity and load condition, so that the solution is not suitable for all running conditions of the electric automobile.

SUMMARY

In order to overcome the problem that under various sensor fault conditions there is no complete decision-making solution to the problem of torque controllability of a distributed wheel hub driving system, the present invention provides a fault-tolerant control method and system capable of establishing a decision-making mechanism oriented to random current and position sensor failure conditions and designing a multivariable decision-making control strategy according to the velocity range and the sensor fault conditions to realize a fault tolerance control process compatible under full velocity range.

In order to achieve the objective, the present invention adopts a technical solution as follows:

A fault tolerance decision-making method for sensor failure of a vehicular wheel hub driving system, wherein a wheel hub motor, a position/velocity sensor, a current sensor, a signal acquisition circuit, a master controller and a power circuit are included, wherein the position/velocity sensor is coaxially connected to the wheel hub motor, the signal acquisition circuit is electrically connected to the position/velocity sensor and the current sensor, respectively, the master controller is electrically connected to the signal acquisition circuit and the power circuit, respectively, and the current sensors are located on the three-phase terminals of the power circuit and on the negative terminal of the DC-bus circuit; the method includes the following steps:

current sensor failure diagnosis:
S1: acquiring a set of four-channel current signals including three-phase currents and a DC-bus current, and verifying the four-channel current signals to diagnose current sensor failure;

position/velocity sensor failure diagnosis:
S2: when the hub motor rotates, acquiring a set of estimated rotor position signal and rotating speed signal by performing a sensorless position estimation algorithm and obtaining a weighted mean value of the estimated rotating speed, and meanwhile, acquiring a set of comparative rotor position signal and the rotating speed signal by the position/velocity sensor measurement, and acquiring the measured value of the rotating speed, and finally, making a position/velocity sensor failure judgment by comparing the amount of deviation between the measured rotating speed and the weighted mean estimated speed according to a preset error threshold;

S3: determining the velocity range according to the mean value of the rotating speed of the hub motor, where the rotating speed is located in high velocity range, selecting the estimated values of the back-EMF-based sensorless algorithm as the source of the position and velocity signals; in the other case where the rotating speed is in low velocity range or equals to zero, selecting the estimated values of the high-frequency-injection-based sensorless algorithm as the source of the position and velocity signals, or switching control strategy from vector control to Current/Frequency (I/F) control or Voltage/Frequency (V/F) control; and fault tolerance control method selections:
S4: according to the failure diagnostic results of both the current sensor and the position/velocity sensor, selecting one control strategy among methods of vector control with encoder M1, back-EMF-based sensorless vector control M2, high-frequency-injection-based sensorless vector control M3, I/F control M4, V/F control M5 and power cut-off protection control M6 for wheel hub motor fault tolerance control.

Preferably, S1 includes the following steps:
S11: defining the three-phase sampling currents as $i_a$, $i_b$ and $i_c$ respectively and the DC-bus sampling current as $i_{bus}$, the verification process of current sensor failure C1 is as follows:
according to the Kirchhoff's Current Law, the current signals $i_a$, $i_b$ and $i_c$ satisfy a condition that the sum of the three current values is zero, i.e., $$i_a + i_b + i_c = 0 \quad (1)$$

the current value of any phase can be verified by the other two-phase current values, represented as:

$$C1: \begin{cases} ||i_a| - |i_b + i_c|| < \varepsilon_i \\ ||i_b| - |i_a + i_c|| < \varepsilon_i \\ ||i_c| - |i_a + i_b|| < \varepsilon_i \\ i_a \neq 0, i_b \neq 0, i_c \neq 0 \end{cases} \quad (2)$$

wherein $\varepsilon_i \approx 0$ is an error threshold value for current sensor fault judgment which is decided by sensor accuracy; in a case where any of the phase current values do not satisfy the restricted relation of inequality (2), it is judged that there is a current sensor failure or deviation fault.

Preferably, S1 further includes the following steps:
S12: in consideration of the DC-bus current reconstruction principle of the Sinusoidal Vector Pulse Width Modulation (SVPWM) signal in the power circuit, continuously sampling the DC-bus current and determining a relation between the DC-bus current and the three-phase currents according to the sector of the voltage vector:

wherein the sector S is decided by the phase angle of the voltage vector:

$$S = \left\lfloor \text{Arctan}(u_\beta, u_\alpha) / \frac{\pi}{3} \right\rfloor + 1; \quad (3)$$

in equation (3), the symbol Arctan is a four-quadrant arctangent function, wherein the semi-square bracket is a mathematical symbol of round down operation, the $u_\alpha$ and $u_\beta$ are the motor terminal voltage represented in $\alpha\beta$ coordination system;

the values of the three-phase current can be reconstructed respectively from the DC-bus current value $i_{bus}$ at a specific moment of sectors S, and the verification process between the sampled value and the reconstructed value of three phases current can be represented as:

$$\begin{cases} C2a: |i_a - i_{bus}| < \varepsilon_i, \text{ where } S = 6 \text{ or } 1 \\ C2b: |i_b - i_{bus}| < \varepsilon_i, \text{ where } S = 2 \text{ or } 3 \\ C2c: |i_c - i_{bus}| < \varepsilon_i, \text{ where } S = 4 \text{ or } 5 \end{cases} \quad (4)$$

according to the judgment criteria of inequalities C2a, C2b and C2c, it can be identified which phase of current sensor has failed;

in summary, by considering the verification results of inequalities (1) (2) and (4), it can be identified whether any current sensor fails and which one fails.

Preferably, S2 includes the following steps:
S21: considering that each driving wheel of the vehicle can obtain two sets of rotating speed signals from both the position/velocity sensor measurement and the sensorless algorithm estimation, a judgment mechanism for position/velocity sensor failure is shown as inequality (5):

$$V1: S_k = \quad (5)$$

$$\begin{cases} 1, & \left| \int_T (\omega_{fb} - \varpi) dt \right| > \sigma \quad \text{The diagnosis of the sensor has failed} \\ 0, & \left| \int_T (\omega_{fb} - \varpi) dt \right| \leq \sigma \quad \text{The sensor has passed the diagnosis} \end{cases}$$

wherein $$\varpi = \frac{1}{2N-1}\left(\sum_{i \in A} \omega_{est\_i} + \sum_{j \in B} \omega_j\right); \quad (6)$$

wherein $S_k$ is the logic symbol of the position/velocity sensor failure judgment of the wheel hub driving unit, T is a verification period, $\omega_{fb}$ represents an measured rotating speed of the position/velocity sensor, $\omega_{est}$ represents the estimated rotating speed, $\overline{\omega}$ is the weighted mean rotating speed, σ is a threshold value of angle for fault judgment, and N is number of the driving wheels; a set A comprises serial numbers of all wheel hub driving units, a set B represents serial numbers of other wheel hub driving units except the failed driving unit, and i and j are serial numbers of elements in the above sets;

for a distributed four-wheel hub driving vehicle, the number of the driving wheels is 4, and it can acquire 2 velocity signals such as the measured speed signal and the estimated speed signal for each driving wheel, hence there are totally 8 available speed values; in a case where the position/velocity sensor of a certain driving wheel fails, the failure logic is judged by comparing each measured speed value with the mean value $\overline{\omega}$ of other 7 speed values of the velocity signals, as shown in equation (6); and in a case where the error accumulation of the angle exceeds the preset threshold value σ and has been maintained for a verification period T, as shown in equation (5), the failure logic symbol $S_k$ is judged to be 1 and otherwise, $S_k$ is judged to be 0, and failure judgment is eliminated and a new round of verification and comparison process is re-started.

Preferably, S2 further includes the following steps:
when the position/velocity sensor failure $S_k$ is 1, the velocity range is judged by the criteria as follows:

$$\begin{cases} \varpi \geq 0.2\omega_n & , \text{ High velocity} \\ 0 < \varpi < 0.2\omega_n & , \text{ Low velocity }, \\ \varpi = 0 & , \text{ Zero velocity} \end{cases} \quad (7)$$

wherein $\omega_n$ is a rated rotating speed of the wheel hub motor.

Figure 4:
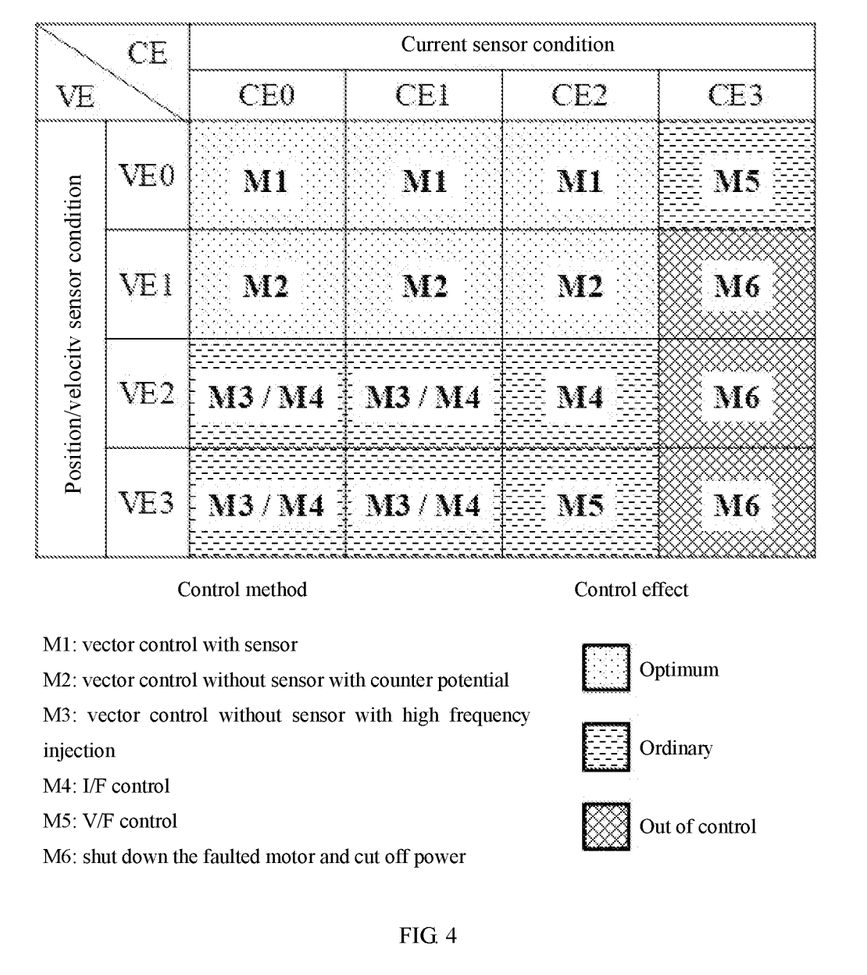
FIG. 4 is an effect graph of a tolerance preferential mechanism for failure of both current and position/velocity sensors in the present invention.

Preferably, in S3, a preferred selection of the wheel hub motor fault tolerance control method is determined by a preferential mechanism according to failure conditions of both current and position/velocity sensors as shown in FIG. 4.

Preferably, in S3, the vector control M1, M2 and M3 are all velocity-current closed-loop controls; the I/F control M4 is a single current closed-loop control; the V/F control M5 is an open-loop control; and the power cut-off control M6 is to shut down the faulted motor.

The present invention further provides a fault tolerance decision-making system for sensor failure of a vehicular wheel hub driving system, including:
a current sensor failure diagnostic module, configured to acquire a set of current signals including three-phase currents and the DC-bus current, and to diagnose the current sensor failure through four-channel current signal verifications;
a position/velocity sensor failure diagnostic module, configured to, under a condition that a vehicle wheel rotates, perform, by a position sensorless algorithm estimation, to acquire an estimated rotating speed signal of the wheel hub motor and to calculate a weighted mean value of the velocity, and meanwhile, to acquire a measured rotating speed signal by the position/velocity sensor, and finally, making a position/velocity sensor failure judgment by comparing the amount of deviation between the measured rotating speed and the weighted mean estimated speed according to a preset error threshold; and
a selection module for a wheel hub motor fault tolerance control method, configured to select one control strategy among methods of vector control with encoder M1, back-EMF-based sensorless vector control M2, high-frequency-injection-based sensorless vector control M3, I/F control M4, V/F control M5 and power cut-off protection control M6.

Preferably, the position/velocity sensor failure diagnostic module further includes:
a fault tolerance control switching module, configured to judge a velocity range where the rotating speed of the wheel hub motor is located according to the position/velocity sensor failure judgment logic; in a case where the rotating speed is located in high velocity range, select the estimated values of the back-EMF-based sensorless algorithm as the source of the position and velocity signals; in the other case where the rotating speed is in low velocity range or equals to zero, select the estimated values of the high-frequency-injection-based sensorless algorithm as the source of the position and velocity signals, or switch control strategy from vector control to Current/Frequency (I/F) control or Voltage/Frequency (V/F) control.

Compared with the prior art, the present invention has the beneficial effects: (1) the present invention designs a decision-making diagnostic logic for different current sensor failure conditions when a driving system of the wheel hub motor of the electric automobile has a current detection fault, designs a decision-making diagnostic logic for different velocity ranges of vehicle running during failure when the system has a position/velocity detection fault, and is used for decision-making of a fault tolerance control method according to above-mentioned comprehensive fault conditions, so that the vehicle can stably decelerated to limp or stop, thereby improving the safety and stability of the distributed wheel hub direct-driven electric vehicle; (2) the present invention comprehensively considers various conditions of sudden faults of the key sensors under a complicated running condition, so that the present invention is of universality and integrity.

DETAILED DESCRIPTION OF THE EMBODIMENTS

In order to describe the present invention clearer, the specific embodiments of the present invention will be described below with reference to drawings. It is apparent that the drawings described below are merely some embodiments of the present invention, and those of ordinary skill in the art further can obtain other drawings according to those drawings and other embodiments without making creative efforts.

Example 1

Figure 1:
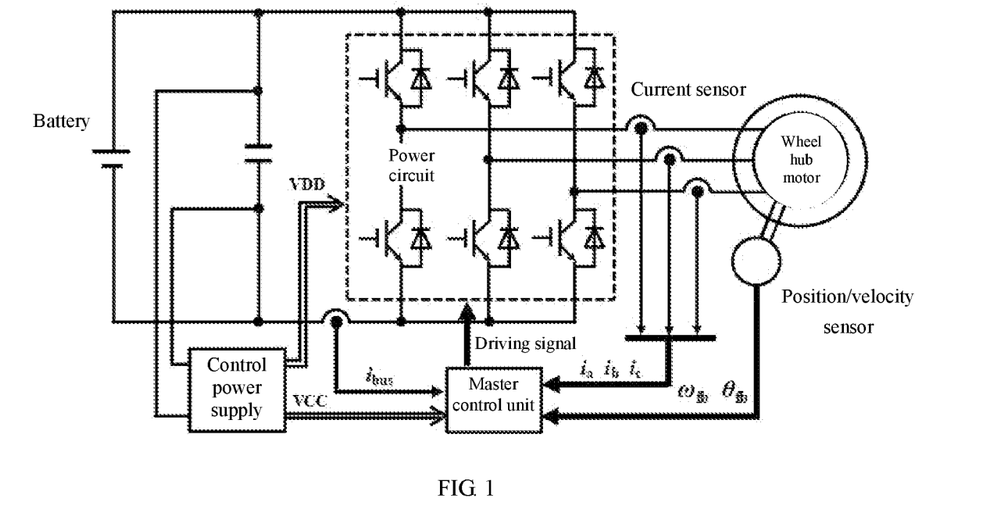
FIG. 1 is a schematic structural diagram of a wheel hub motor driving system of an electric automobile in the present invention.

As shown in FIG. 1, the present invention provides a fault tolerance decision-making method for sensor failure of a vehicular wheel hub driving system, wherein a wheel hub motor, a position/velocity sensor, a current sensor, a signal acquisition circuit, a master controller and a power circuit are included; the position/velocity sensor is coaxially connected to the wheel hub motor, the signal acquisition circuit is electrically connected to the position/velocity sensor and the current sensor, respectively, the master controller is electrically connected to the signal acquisition circuit and the power circuit, respectively, and the current sensors are located on the three-phase terminals of the power circuit and on the negative terminal of the DC-bus circuit; the method includes the following steps:

current sensor failure diagnosis:
S1: a set of four-channel current signals including three-phase currents and a DC-bus current are acquired, and the four-channel current signals are verified to diagnose current sensor failure;
position/velocity sensor failure diagnosis:
S2: when the hub motor rotates, a set of estimated position signal and rotating speed signal are acquired by performing a sensorless position estimation algorithm and a weighted mean value of the estimated rotating speed is obtained, and meanwhile, a set of comparative rotor position signal and the rotating speed signal are acquired by the position/velocity sensor measurement, and the measured value of the rotating speed is acquired, and finally, a position/velocity sensor failure judgment is made by comparing the amount of deviation between the measured rotating speed and the weighted mean estimated speed according to a preset error threshold;
S3: the velocity range is determined according to the mean value of the rotating speed of the hub motor, where the rotating speed is located in high velocity range, the estimated values of the back-EMF-based sensorless algorithm is selected as the source of the position and velocity signals; in the other case where the rotating speed is in low velocity range or equals to zero, the estimated values of the high-frequency-injection-based sensorless algorithm are selected as the source of the position and velocity signals, or control strategy is switched from vector control to Current/Frequency (I/F) control or Voltage/Frequency (V/F) control; and
selection of a wheel hub motor fault tolerance control method:
S4: according to the failure diagnostic results of both the current sensor and the position/velocity sensor, one control strategy is selected among methods of vector control with encoder M1, back-EMF-based sensorless vector control M2, high-frequency-injection-based sensorless vector control M3, I/F control M4, V/F control M5 and power cut-off protection control M6.
Further, S1 includes the following steps:

S11: the three-phase currents are defined as $i_a$, $i_b$ and $i_c$ respectively and the DC-bus sampling current as $i_{bus}$, wherein the verification process C1 is as follows:
according to the Kirchhoff's Current Law, the current signals $i_a$, $i_b$ and $i_c$ satisfy a condition that the sum of the three current values is zero, i.e., $$i_a + i_b + i_c = 0 \quad (1)$$

the current value of any phase can be verified by the other two-phase current values, represented as:

$$C1: \begin{cases} ||i_a| - |i_b + i_c|| < \varepsilon_i \\ ||i_b| - |i_a + i_c|| < \varepsilon_i \\ ||i_c| - |i_a + i_b|| < \varepsilon_i \\ i_a \neq 0, \; i_b \neq 0, \; i_c \neq 0 \end{cases} \quad (2)$$

wherein $\varepsilon_i \approx 0$ is an error threshold value for current sensor fault judgment which is decided by sensor accuracy; in a case where any of the phase current values do not satisfy the restricted relation of inequality (2), it is judged that there is a current sensor failure or deviation fault.

S12: in consideration of the DC-bus current reconstruction principle of the Sinusoidal Vector Pulse Width Modulation (SVPWM) signal in the power circuit, continuously sampling the DC-bus current and determining a relation between the DC-bus current and the three-phase currents according to the sector of the voltage vector.

Table 1 Relation between the DC-bus current and the phase currents in SVPWM current reconstruction

TABLE 1

Relation between the DC-bus and the phase currents in SVPWM current reconstruction

Figure 2:
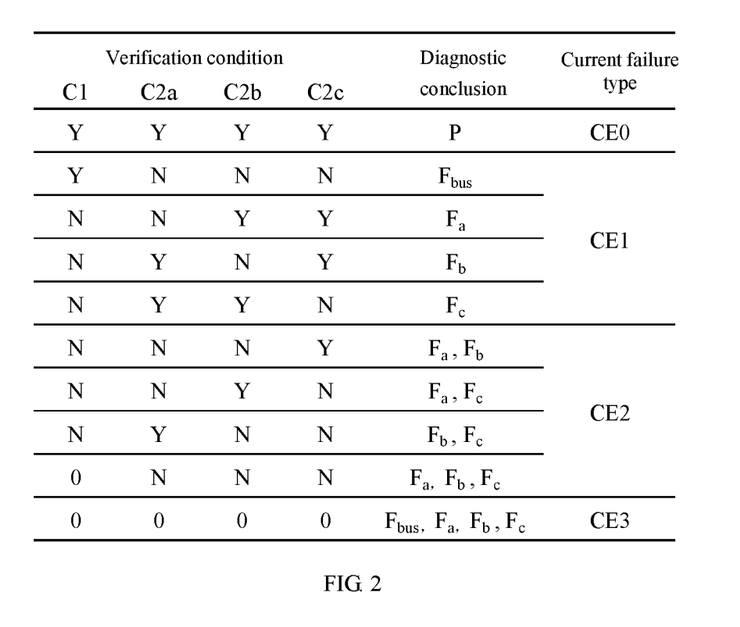
FIG. 2 is a logic diagram for failure diagnosis and verifying of current sensors in the present invention.

| Sector | Sample 1 | Sample 2 |
|---|---|---|
| 1 | $i_{bus} = i_a$ | $i_{bus} = -i_c$ |
| 2 | $i_{bus} = i_b$ | $i_{bus} = -i_c$ |
| 3 | $i_{bus} = i_b$ | $i_{bus} = -i_a$ |
| 4 | $i_{bus} = i_c$ | $i_{bus} = -i_a$ |
| 5 | $i_{bus} = i_c$ | $i_{bus} = -i_b$ |
| 6 | $i_{bus} = i_a$ | $i_{bus} = -i_b$ | wherein the sector S is decided by the phase angle of a voltage vector:

$$S = \left\lfloor \text{Arctan}(u_\beta, u_\alpha) / \frac{\pi}{3} \right\rfloor + 1; \quad (3)$$

in equation (3), the symbol Arctan is a four-quadrant arctangent function, wherein the semi-square bracket is a mathematical symbol of round down operation.
the current value of any phase can be verified by a DC-bus current sampled value at a specific time, represented as:

$$\begin{cases} C2a: |i_a - i_{bus}| < \varepsilon_i \\ C2b: |i_b - i_{bus}| < \varepsilon_i \\ C2c: |i_c - i_{bus}| < \varepsilon_i \end{cases} \quad (4)$$

in the process of C2a, C2b and C2c, if any term of the inequalities is not valid, it can be judged that the corresponding phase sensor has failed;

comprehensive consideration of verification results of inequalities (1) (2) and (4) are combined to judge a circuit failure condition of the current sensor, which not only can judge single failure, multiple failures and all failures of the phase current sensor, but also can conclude failure of the DC-bus current sensor, with a decision-making logic shown in FIG. 2.

In FIG. 2, Y represents that the sensors have effective signals and the logic verification is YES satisfied, N represents that the sensors have effective signals and the logic verification is NOT satisfied, and 0 represents that the verified sensor has no signal; in a diagnostic conclusion, P represents that all sensors have PASSED the diagnosis, $F_a$, $F_b$, $F_c$ and $F_{bus}$ respectively means that the diagnosis of phase a, phase b, phase c or DC-bus sensor has FAILED.

According to a fault diagnostic result of the current sensor, the current failure type is divided into CE0-CE3, wherein CE0 represents that all sensors are normal, and the control system can acquire a precise current signal. CE1 represents that a part of sensors fails, and the controller can acquire a complete current signal according to a circuit law. CE2 represents that a part of sensors fails, and the controller can acquire a current signal with loss in precision by means of a reconstruction algorithm. CE3 represents that a part of or all the sensors fail, effective current signals cannot be acquired.

In S1, in the sampling, the current detection devices including three hall current sensors mounted on input terminals of the motor phases and a current sensor mounted on the DC-bus terminal for battery overcurrent protection. The four-channel current signals including phase currents $i_a$, $i_b$, $i_c$ and the DC-bus current $i_{bus}$ are sampled at the abovementioned detection position.

Further, S2 includes the following steps:

S21: considering that each driving wheel of the vehicle can obtain two sets of rotating speed signals from both the position/velocity sensor measurement and the sensorless algorithm estimation, a judgment mechanism for position/velocity sensor failure is shown as inequality (5):

$$V1: S_k = \begin{cases} 1, & \left|\int_T (\omega_{fb} - \varpi)dt\right| > \sigma \quad \text{The diagnosis of the sensor has failed} \\ 0, & \left|\int_T (\omega_{fb} - \varpi)dt\right| \le \sigma \quad \text{The sensor has passed the diagnosis} \end{cases} \quad (5)$$

wherein $$\varpi = \frac{1}{2N-1}\left(\sum_{i \in A}\omega_{est\_i} + \sum_{j \in B}\omega_j\right); \quad (6)$$

wherein $S_k$ is the logic symbol of the position/velocity sensor failure judgment of the wheel hub driving unit, T is a verification period, $\omega_{fb}$ represents the measured rotating speed of the position/velocity sensor, $\omega_{est}$ represents the estimated rotating speed, $\varpi$ is the weighted mean rotating speed, $\sigma$ is a threshold value of angle for fault judgment, and N is number of the driving wheels; a set A comprises serial numbers of all wheel hub driving units, a set B represents serial numbers of other wheel hub driving units except the failed driving unit, and i and j are serial numbers of elements in the above sets;

for a distributed four-wheel hub driving vehicle, the number of the driving wheels is 4, and it can acquire 2 velocity signals such as the measured speed signal and the estimated speed signal for each driving wheel, hence there are totally 8 available speed values; in a case where the position/velocity sensor of a certain driving wheel fails, the failure logic is judged by comparing each measured speed value with the mean value $\varpi$ of other 7 speed values of the velocity signals, shown in equation (6); and in a case where the error accumulation of the angle exceeds the preset threshold value $\sigma$ and has been maintained for a verification period T, the failure logic symbol $S_k$ is judged to be 1 and otherwise, $S_k$ is judged to be 0.

Figure 3:
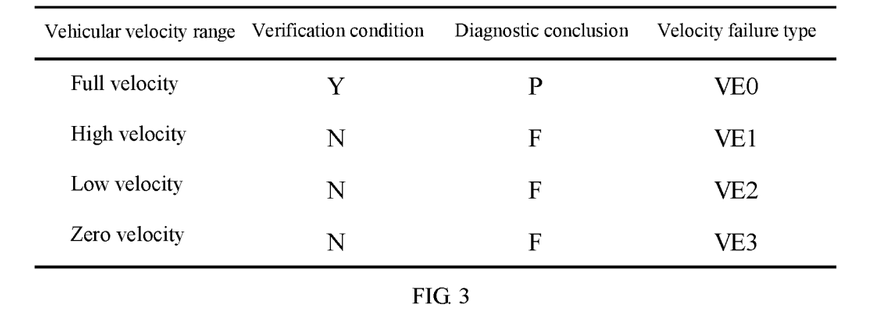
FIG. 3 is a logic diagram for failure diagnosis and verifying of position/velocity sensors in the present invention.

Further, the threshold value $\sigma$ and the verification period T shall be defined according to a specific working condition; in a case where the threshold value and the verification period are too small, a maloperation probability will be increased; and in a case where the threshold value and the verification period are too large, the sensitivity for fault judgment will be reduced, and the smoothness of the fault tolerance switching process will be affected, wherein a typical value $\sigma$ is 30°, ($\sigma$ is an electrical angle rather than a mechanical angle), T=100 ms;

further, considering that a special extreme condition of successive failure of multiple driving wheels, polling detection is performed on the sensor signals of the driving units usually. Once the fault logic of a certain driving unit is judged as 1, the serial number is excluded from the measured sets A and B, and sensor failure conditions of the rest of driving wheels are continuously monitored according to the process in equations (5) and (6).

when the failure of the position/velocity sensor occurs, the sensor can be replaced by the sensorless algorithm to acquire the motor position and velocity information, and the controller can still perform a torque-closed-loop vector control. However, different sensorless algorithms are adapted to different velocity ranges, and all the algorithms need to satisfy a precondition that the current signals are precise and reliable. Therefore, the velocity failure types should be classified by the rotating speed range at the moment of sensor failure, as shown in FIG. 3:

In FIG. 3, Y represents that the logic verification of the sensor is YES satisfied, and N represents that logic verification is NOT satisfied; in a diagnostic conclusion, P represents that the sensor has PASSED the diagnosis, and F represents deviation or failure of the sensor; the velocity failure types are divided into VE0-VE3, wherein VE0 represents that the sensor has PASSED the diagnosis, VE1 represents that the diagnosis the sensor has FAILED at a high velocity, VE2 represents that the diagnosis of the sensor has FAILED at a low velocity, and VE3 represents that the diagnosis of the sensor has FAILED when the hub motor is at a zero velocity and is idled.

Further, S2 further includes the following steps:

when the failure logic symbol $S_k$ is 1, the velocity range is judged by the criteria as follows:

$$\begin{cases} \varpi \ge 0.2\omega_n & , \text{High velocity} \\ 0 < \varpi < 0.2\omega_n & , \text{Low velocity} \\ \varpi = 0 & , \text{Zero velocity} \end{cases} \quad (7)$$

wherein $\omega_n$ is the rated rotating speed of the wheel hub motor.

Recording the mean rotating speed value $\bar{\omega}$ when the fault logic $S_k$ changes from 0 to 1, and comparing the recorded value with a given threshold value of high and low velocity ranges. Preferably, the velocity boundary value is set to be 15%-20% of the rated rotating speed of the hub motor, and a typical value is $0.2\omega_n$.

Further, in S3, a preferred selection of the wheel hub motor fault tolerance control method is determined by a preferential mechanism according to failure conditions of both current and position/velocity sensors as shown in FIG. 4.

Further, in S3, the vector control M1, M2 and M3 are all velocity-current closed-loop controls; the I/F control M4 is a single current closed-loop control; the V/F control M5 is an open-loop control; and the power cut-off control M6 is to shut down the faulted motor.

The vector control with the sensor M1 needs to be implemented under a condition that the current and velocity position signals are both valid, the sensorless vector control M2 or M3 and the I/F control M4 can be implemented in a case where only the current signal is valid, and the V/F control M5 can be implemented without the current and velocity/position signal feedbacks.

A preferred decision-making mechanism for a double dimensionality fault tolerance control method is established according to the failure type of the current sensor and the position/velocity sensor in FIG. 2 and FIG. 3, as shown in FIG. 4.

Figure 5:
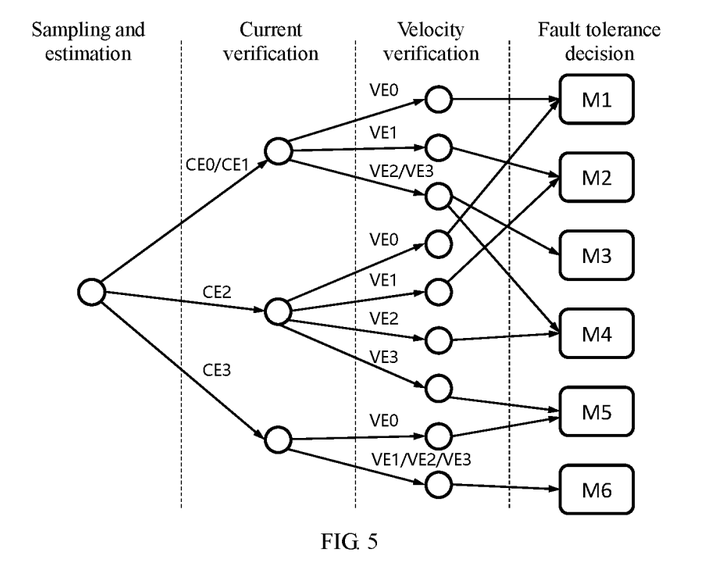
FIG. 5 is a decision-making tree diagram of a fault tolerance control method for key sensor failure of a driving system in the present invention.

According to the control strategy preferential mechanism in FIG. 4, a fault tolerance decision-making tree for key sensor failure of a wheel hub direct-driven electric automobile is as shown in FIG. 5.

The present invention further provides a fault tolerance decision-making system for sensor failure of a vehicle wheel hub driving system, including:
- a current sensor failure diagnostic module, configured to acquire a set of current signals including three-phase currents and the DC-bus current, and to diagnose the current sensor failure through four-channel current signal verifications;
- a position/velocity sensor failure diagnostic module, configured to, under a condition that a vehicle wheel rotates, perform, by a position sensorless algorithm estimation, to acquire an estimated rotating speed signal of the wheel hub motor and to calculate a weighted mean value of the velocity, and meanwhile, to acquire a measured rotating speed signal by the position/velocity sensor, and finally, making a position/velocity sensor failure judgment by comparing the amount of deviation between the measured rotating speed and the weighted mean estimated speed according to a preset error threshold; and
- a selection module for a wheel hub motor fault tolerance control method, configured to select one control strategy among methods of vector control with encoder M1, back-EMF-based sensorless vector control M2, high-frequency-injection-based sensorless vector control M3, I/F control M4, V/F control M5 and power cut-off protection control M6.

Further, the position/velocity sensor failure diagnostic module further includes:
- a fault tolerance control switching module, configured to judge a velocity range where the rotating speed of the wheel hub motor is located according to the position/velocity sensor failure judgment logic; in a case where the rotating speed is located in high velocity range, select the estimated values of the back-EMF-based sensorless algorithm as the source of the position and velocity signals; in the other case where the rotating speed is in low velocity range or equals to zero, select the estimated values of the high-frequency-injection-based sensorless algorithm as the source of the position and velocity signals, or switch control strategy from vector control to Current/Frequency (I/F) control or Voltage/Frequency (V/F) control.

The present invention designs a diagnostic logic for decision-making of effectiveness of a current signal for different current sensor failure conditions when a driving system of the wheel hub motor of the electric automobile has a current detection fault, designs a diagnostic logic for decision-making of effectiveness of a signal of a position sensorless algorithm for different velocity ranges of vehicle running during failure when the system has a position/velocity detection fault, and is used for decision-making of a fault tolerance control method of the motor according to a comprehensive fault condition of the above-mentioned two types of sensors, so that the vehicle can still be stably decelerated to limp or stop under a condition that a part of sensors fail, thereby improving the safety and stability of the distributed wheel hub direct-driven electric vehicle. The present invention comprehensively considers various conditions of sudden faults of the key sensors of the vehicle under a complicated running condition, so that the present invention is of universality and integrity.

Preferred embodiments and principle of the present invention are merely described in detail above. Those of ordinary skill in the art can make alternations on specific embodiments, and these alternations shall be regarded within the protection scope of the present invention.

The invention claimed is:

1. A fault tolerance decision-making method for sensor failure of a vehicle wheel hub driving system, wherein a wheel hub motor, a position/velocity sensor, a current sensor, a signal acquisition circuit, a master control unit and a driving circuit are included, wherein the position/velocity sensor is coaxially connected to the wheel hub motor, the signal acquisition circuit is electrically connected to the position/velocity sensor and the current sensor, respectively, the master control unit is electrically connected to the signal acquisition circuit and the driving circuit, respectively, and the current sensor is located on a lower bridge arm side of the driving circuit; the method comprises the following steps:

current sensor failure diagnosis:
S1: acquiring a four-way current signal set of three-phase currents and a bus current through detection, and verifying four-way current signals to diagnose a failed current sensor;

position/velocity sensor failure diagnosis:
S2: under a condition that a vehicle wheel rotates, performing, by a position sensor-free algorithm, estimation to acquire a position and a rotating speed signal of the wheel hub motor and obtaining a weighted mean value of a velocity, and meanwhile, acquiring a rotor position signal and the rotating speed signal of the wheel hub motor by the position/velocity sensor, and acquiring a rotating speed measured value, and finally, verifying an amount of deviation between the rotating speed measured value and the weighted mean value of the velocity by means of an error comparison method, and comparing the amount of deviation with a set threshold value to obtain a position/velocity sensor failure judgment logic;

S3: judging a velocity range where the rotating speed of the wheel hub motor is located according to the position/velocity sensor failure judgment logic; in a case where the rotating speed of the wheel hub motor is in a high velocity range, switching a source of the position and velocity signals of the wheel hub motor to the counter potential-based position sensor-free algorithm; in a case where the rotating speed of the wheel hub motor is in a low velocity range and a zero velocity range, switching the source of the position and velocity signals of the wheel hub motor to a high-frequency injection-based position sensor-free algorithm or an Intensity/Frequency (I/F), Voltage/Frequency (V/F) control method; and selection of a wheel hub motor fault tolerance control method:

S4: selecting one mode among vector control M1 with the sensor, vector control M2 without the sensor of the counter potential algorithm, vector control M3 without the sensor of the high-frequency injection algorithm, I/F ratio control M4, V/F ratio control M5 and complete cut-off motor power output control M6 in combination with a current sensor failure diagnostic condition and a position/velocity sensor failure diagnostic condition for wheel hub motor fault tolerance control;

S2 comprises the following steps:

S21: in consideration of acquisition of two sets of rotating speed signals by both the position/velocity sensor and the sensor-free algorithm of each driving wheel, giving a judgment mechanism for position/velocity sensor failure, shown as a formula (1):

$$V1: S_k = \begin{cases} 1, & \left|\int_T (\omega_{fb} - \varpi)dt\right| > \sigma \text{Sensor fails} \\ 0, & \left|\int_T (\omega_{fb} - \varpi)dt\right| \leq \sigma \text{Sensor is normal} \end{cases} \quad (5)$$

wherein $$\varpi = \frac{1}{2N-1}\left(\sum_{i \in A} \omega_{est\_i} + \sum_{j \in B} \omega_j\right); \quad (6)$$

wherein $S_k$ is the position/velocity sensor failure judgment logic of the wheel hub driving unit, T is a verification period, $\omega_{fb}$ represents an actually measured rotating speed of the position/velocity sensor, $\omega_{est}$ represents an estimated rotating speed, $\varpi$ is a weighted mean rotating speed, $\sigma$ is a threshold value angel for fault tolerance judgment, and N is a number of the driving wheels; a set A comprises serial numbers of all wheel hub driving units, a set B represents serial numbers of other wheel hub driving units except failed wheel hub driving units, and i and j are serial numbers of elements in the sets;

for a distributed four-wheel direct-driven vehicle, the number of the driving wheels is 4, two groups of velocity information such as actually measured velocity and estimated velocity can be acquired for each driving wheel, and totally eight groups of velocity information can be acquired; in a case where the position/velocity sensor of a certain driving wheel fails, the vehicle speed signal of the position/velocity sensor is verified and the failure logic is judged by taking a mean value $\overline{\omega}$ of the rest of seven groups of velocity signals as a reference quantity, shown in formula (6); and in a case where an error accumulation exceeds a preset threshold value $\sigma$ and is maintained for a verification period T, the failure $S_k$ is judged to be 1 and otherwise, $S_k$ is judged to be 0, and failure judgment is eliminated and a new round of verification and comparison process is re-started.

2. The fault tolerance decision-making method for sensor failure of a vehicle wheel hub driving system according to claim 1, wherein S1 comprises the following steps:

S11: setting the three-phase currents to be $i_a$, $i_b$ and $i_c$ respectively and the bus current to be $i_{bus}$, with a verification process C1 as follows:

according to the Kirchhoff's Current Law, three-way current signals $i_a$, $i_b$ and $i_c$ satisfy a condition that the three-way current signals are added to zero, i.e., $$i_a - i_b + i_c = 0 \quad (1)$$

the current value of any phase can be verified by the other two-phase current values, represented as:

$$C1: \begin{cases} ||i_a| - |i_b + i_c|| < \varepsilon_i \\ ||i_b| - |i_a + i_c|| < \varepsilon_i \\ ||i_c| - |i_a + i_b|| < \varepsilon_i \\ i_a \neq 0, \, i_b \neq 0, \, i_c \neq 0 \end{cases}, \quad (2)$$

wherein $\varepsilon i \approx 0$ is an error threshold value for current sensor fault judgment and is decided by a current precision allowed by the motor driving system; in a case where the phase current values do not satisfy a restricted relation of formula (2), it is judged that there is a current sensor failure or deviation fault.

3. The fault tolerance decision-making method for sensor failure of a vehicle wheel hub driving system according to claim 2, wherein S1 further comprises the following steps:

S12: in consideration of a sinusoidal vector pulse modulation signal (SVPWM) in the driving circuit, continuously sampling the current twice in two different SVPWM nonzero voltage vector time points based on a bus current reconstruction principle, and determining a relation between the bus current and the three-phase currents according to a section position of a current voltage vector:

wherein the sector S of the current voltage vector is decided by a voltage vector phase angle at a current time:

$$S = \left\lfloor \text{Arctan}(u_\beta, u_\alpha)/\frac{\pi}{3} \right\rfloor + 1; \quad (3)$$

in formula (3), Arctan is a four-quadrant arctan function, wherein the semi-square bracket is a mathematical symbol of "downward round";

the current value of any phase can be verified by a bus current sampled value at a specific time, represented as:

$$\begin{cases} C2a: |i_a - i_{bus}| < \varepsilon_i \\ C2b: |i_b - i_{bus}| < \varepsilon_i \\ C2c: |i_c - i_{bus}| < \varepsilon_i \end{cases} \quad (4)$$

in the process of C2a, C2b and C2c, which phase of current sensor fails is specifically verified;

various conditions of verification results of formulae (1), (2) and (4) are integrated to judge a circuit failure condition of the current sensor.

4. The fault tolerance decision-making method for sensor failure of a vehicle wheel hub driving system according to claim 1, wherein S2 further comprises the following steps:

when the position/velocity sensor failure $S_k$ of the vehicle is 1, the velocity range where the rotating speed of the wheel hub motor is located is judged, with a judgment standard for the velocity range as follows:

$$\begin{cases} \varpi \geq 0.2\omega_n & \text{High velocity} \\ 0 < \varpi < 0.2\omega_n & \text{Low velocity} \\ \varpi = 0 & \end{cases} \quad (7)$$

wherein on is a rated rotating speed of the wheel hub motor.

5. The fault tolerance decision-making method for sensor failure of a vehicle wheel hub driving system according to claim 1, wherein in S3, except for the complete cut-off motor power output control M6, a preferred selection sequence of the wheel hub motor fault tolerance control method is as follows:

vector control M1 with the sensor>vector control M2 without the sensor of the counter potential algorithm or vector control M3 without the sensor of the high-frequency injection algorithm>I/F ratio control M4>V/F ratio control M5.

6. The fault tolerance decision-making method for sensor failure of a vehicle wheel hub driving system according to claim 1, wherein in S3, the vector control M1 with the sensor, the vector control M2 without the sensor of the counter potential algorithm and the vector control M3 without the sensor of the high-frequency injection algorithm all are velocity-current double closed loops; the I/F ratio control M4 is a current single closed loop; and the V/F ratio control M5 is a full opened loop.

7. A fault tolerance decision-making system for sensor failure of a vehicle wheel hub driving system, used for implementing the fault tolerance decision-making method for sensor failure of a vehicle wheel hub driving system according to claim 1, wherein the fault tolerance decision-making system for sensor failure of a vehicle wheel hub driving system comprises:

a current sensor failure diagnostic module, configured to acquire a four-way current signal set of three-phase currents and a bus current through detection, and to verify four-way current signals to diagnose a failed current sensor;

a position/velocity sensor failure diagnostic module, configured to, under a condition that a vehicle wheel rotates, perform, by a position sensor-free algorithm, estimation to acquire a position and a rotating speed signal of the wheel hub motor and to obtain a weighted mean value of a velocity, and meanwhile, to acquire a rotor position signal and the rotating speed signal of the wheel hub motor by the position/velocity sensor, and to acquire a rotating speed measured value, and finally, to verify an amount of deviation between the rotating speed measured value and the weighted mean value of the velocity by means of an error comparison method, and to compare the amount of deviation with a set threshold value to obtain a position/velocity sensor failure judgment logic; and a selection module for a wheel hub motor fault tolerance control method, configured to select one mode among vector control M1 with the sensor, vector control M2 without the sensor of the counter potential algorithm, vector control M3 without the sensor of the high-frequency injection algorithm, I/F ratio control M4, V/F ratio control M5 and complete cut-off motor power output control M6 in combination with a current sensor failure diagnostic condition and a position/velocity sensor failure diagnostic condition for wheel hub motor fault tolerance control.

8. The fault tolerance decision-making system for sensor failure of a vehicle wheel hub driving system according to claim 7, wherein the current sensor failure diagnostic module further comprises:

a fault tolerance control switching module, configured to judge a velocity range where the rotating speed of the wheel hub motor is located according to the position/velocity sensor failure judgment logic; in a case where the rotating speed of the wheel hub motor is in a high velocity range, switch a source of the position and velocity signals of the wheel hub motor to the counter potential-based position sensor-free algorithm; in a case where the rotating speed of the wheel hub motor is in a low velocity range and a zero velocity range, switch the source of the position and velocity signals of the wheel hub motor to a high-frequency injection-based position sensor-free algorithm or an I/F, V/F control method.

* * * * *